United States Patent
Linderman

(10) Patent No.: US 10,291,177 B2
(45) Date of Patent: May 14, 2019

(54) PV MODULE POWER ELECTRONICS MOUNTING SYSTEM WITH COMPRESSION SPRING

(71) Applicant: Enphase Energy, Inc., Petaluma, CA (US)

(72) Inventor: Ryan Linderman, Oakland, CA (US)

(73) Assignee: Enphase Energy, Inc., Petaluma, CA (US)

( * ) Notice: Subject to any disclaimer, the term of this patent is extended or adjusted under 35 U.S.C. 154(b) by 36 days.

(21) Appl. No.: 15/267,894

(22) Filed: Sep. 16, 2016

(65) Prior Publication Data

US 2017/0085218 A1 Mar. 23, 2017

Related U.S. Application Data

(60) Provisional application No. 62/219,884, filed on Sep. 17, 2015.

(51) Int. Cl.
| | |
|---|---|
| *H02S 40/32* | (2014.01) |
| *H02S 40/00* | (2014.01) |
| *H01L 31/02* | (2006.01) |
| *H02S 40/34* | (2014.01) |
| *H02S 40/30* | (2014.01) |
| *H02B 1/46* | (2006.01) |
| *H01L 31/049* | (2014.01) |
| *F16B 1/00* | (2006.01) |

(52) U.S. Cl.
CPC ............. *H02S 40/32* (2014.12); *H01L 31/02* (2013.01); *H02S 40/00* (2013.01); *H02S 40/30* (2014.12); *H02S 40/34* (2014.12); *F16B 1/00* (2013.01); *H01L 31/049* (2014.12); *H02B 1/46* (2013.01); *Y02E 10/50* (2013.01)

(58) Field of Classification Search
CPC .......... H02S 40/32; H02S 40/38; H02S 40/00; H01L 31/049; H01L 31/02; F16B 1/00; H02B 1/46
See application file for complete search history.

(56) References Cited

U.S. PATENT DOCUMENTS

| 9,099,849 B2 | 8/2015 | Shmukler et al. |
| 2014/0166356 A1* | 6/2014 | Shmukler ................ F16B 1/00 174/541 |
| 2016/0013842 A1 | 1/2016 | Linderman |

OTHER PUBLICATIONS

Porteiro, "Spring design optimization with fatigue" USF Thesis, 2010 (from USF scholar commons).*

* cited by examiner

*Primary Examiner* — Matthew T Martin
(74) *Attorney, Agent, or Firm* — Moser Taboada

(57) ABSTRACT

An apparatus and system for mechanically coupling a power conditioning unit (PCU) to a photovoltaic (PV) module. In one embodiment, the apparatus comprises a base member, adapted for mounting a power conditioning unit (PCU) on a PV module backsheet, comprising a plurality of PCU retention members for retaining the PCU; and at least one compression spring, coupled to the base member, for maintaining the PCU in a position, with respect to the PV module backsheet, that can be dynamically changed between a first position and a second position.

20 Claims, 5 Drawing Sheets

PV MODULE POWER ELECTRONICS MOUNTING SYSTEM WITH COMPRESSION SPRING

CROSS-REFERENCE TO RELATED APPLICATIONS

This application claims benefit of U.S. provisional patent application Ser. No. 62/219,884, entitled "PV Module Power Electronics Mounting System with Compression Spring" and filed Sep. 17, 2015, which is herein incorporated in its entirety by reference.

BACKGROUND OF THE INVENTION

Field of the Invention

Solar panels, or photovoltaic (PV) modules, convert energy from sunlight received into direct current (DC). In some solar power systems, the PV modules may be coupled to power conditioning units (PCUs), such as DC-DC converters or DC-AC inverters, in a distributed architecture; i.e., one PCU per PV module. In such systems, each PCU may be mounted to the face (i.e., backsheet surface or superstrate) of the corresponding PV module.

One technique known in the art for mounting a PCU to a PV module face is a sliding rail backsheet mount system. In such a system, mounting rails are adhered to the PV module face and the PCU can be slid along the rails into position. However, the sliding rail system requires almost twice the footprint of the PCU in order to insert/remove the PCU (due to the PCU having to slide up/down the rails) and maintains the inverter in a fixed position which respect to the PV module which may not be ideal for shipping combined PCU/PV module assemblies.

Therefore, there is a need in the art for an apparatus for efficiently mounting a power conditioner to a PV module frame

SUMMARY OF THE INVENTION

Embodiments of the present invention generally relate to an apparatus for mechanically coupling a power conditioning unit (PCU) to a photovoltaic (PV) module substantially as shown and/or described in connection with at least one of the figures, as set forth more completely in the claims.

Various advantages, aspects and novel features of the present disclosure, as well as details of an illustrated embodiment thereof, will be more fully understood from the following description and drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally relate to a mounting assembly for mounting a power conditioning unit (PCU) to a photovoltaic (PV) module. The mounting assembly comprises a base member having multiple retention members for retaining the PCU. The mounting assembly further comprises at least one compression spring that maintains the PCU in one or two positions with respect to the PV module and allows the PCU position to be dynamically changed. In a first position, the PCU is pressed flat against the backsheet of the PV module, while in the second position an airgap is present between the PCU and the PV module backsheet for thermal management.

Figure 1:
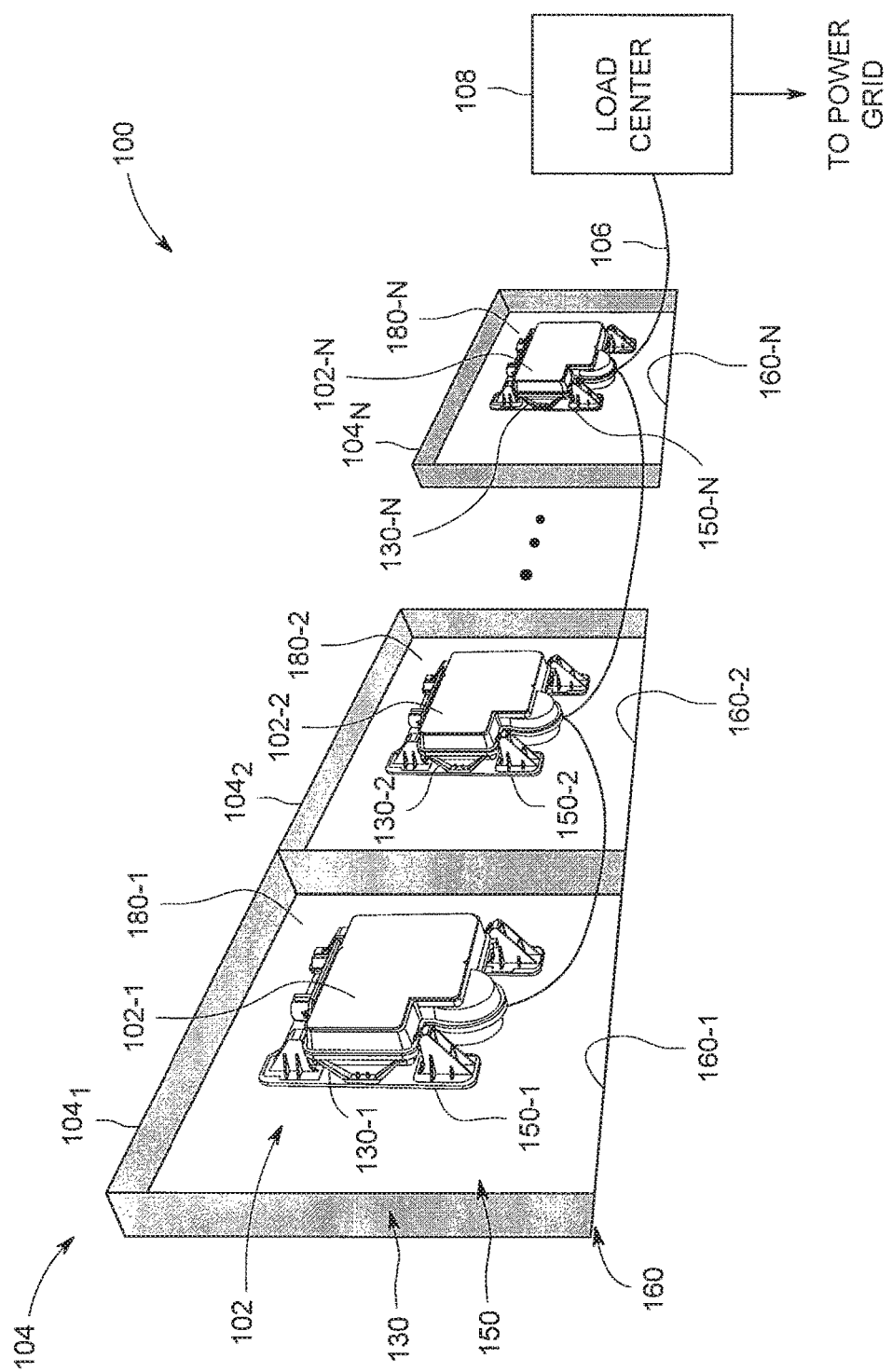
FIG. 1 is a block diagram depicting a physical layout of a photovoltaic (PV) system in accordance with one or more embodiments of the present invention.

FIG. 1 is a block diagram depicting a physical layout of a photovoltaic (PV) system 100 in accordance with one or more embodiments of the present invention.

The PV system 100 comprises a plurality of power conditioning units (PCUs) $102_1$, $102_2$ ... $102_n$ (collectively PCUs 102, or power electronics 102), a plurality of PV modules $104_1$, $104_2$ ... $104_n$ (collectively PV modules 104), and a plurality of PCU mounting assemblies $150_1$, $150_2$ ... $150_n$ (collectively PCU mounting assemblies or mounting assemblies 150).

Each PV module $104_1$, $104_2$ ... $104_n$ comprises a structural frame $160_1$, $160_2$ ... $160_n$, respectively, collectively referred to as frames 160. Each of the frames 160 surrounds the perimeter of the corresponding PV module 104 and may be constructed of any rigid material, such as aluminum, rigid plastic, and the like, or any combination of such rigid materials. The frames 160 of the PV modules 104 are generally coupled flush with the frames 160 of neighboring PV modules 104 in a horizontal direction.

Each PCU $102_1$, $102_2$ ... $102_n$ is mechanically coupled to a corresponding PV module $104_1$, $104_2$ ... $104_n$ via a corresponding mounting assembly $150_1$, $150_2$ ... $150_n$, respectively, in a one-to-one correspondence. Each mounting assembly $150_1$, $150_2$ ... $150_n$ is adhered to the surface of a respective PV module backsheet $180_1$, $180_2$ ... $180_n$ (i.e., the rear PV module face that is not exposed to sunlight) for retaining the corresponding PCU $102_1$, $102_2$ ... $102_n$ proximate the PV module $104_1$, $104_2$ ... $104_n$. Each combined PV module 104/PCU 102/mounting assembly 150 may be referred to as a power module assembly.

In accordance with one or more embodiments of the present invention, each of the mounting assemblies $150_1$, $150_2$ ... $150_n$ comprises one or more compression springs $130_1$, $130_2$ ... $130_n$ (collectively compression springs 130), respectively, that enables the corresponding PCU 102 to be pressed flat to respective the PV module backsheet $180_1$, $180_2$ ... $180_n$ (collectively referred to as PV module backsheet 180), for example during shipping, and, once installed, to be retained proximate the corresponding PV module 104 with a defined gap between the PCU 102 and the PV module 104 that allows airflow between the components for thermal management of the PCU 102 and the PV module 102. In some embodiments, the gap may be on the order of 5-25 mm and may depend on topology features of the PCU enclosure.

In addition to being mechanically mounted to the PV modules 104, the PCUs $102_1$, $102_2$ ... $102_n$ are electrically coupled to the PV modules $104_1$, $104_2$ ... $104_n$ to receive the generated DC power from the corresponding PV module 104. Examples of such coupling may be found commonly assigned U.S. patent application Ser. No. 14/793,164, entitled "Photovoltaic Module with Integrated Power Electronics", filed Jul. 7, 2015, which is herein incorporated in its entirety by reference.

In some embodiments, the PCUs 102 are DC-AC inverters for inverting DC power generated by the PV modules 104 to AC power. In such embodiments, the PCUs 102 are coupled to a load center 108 via an AC bus 106 for distributing the AC output produced by the PCUs 102. The load center 108 may house connections between an AC commercial power grid distribution system and the AC bus 106 for coupling the generated AC power to the grid. Additionally or alternatively, the generated AC power may be coupled to commercial and/or residential systems via the load center 108, as well as stored for later use (for example, the generated energy may be stored utilizing batteries, heated water, hydro pumping, $H_2O$-to-hydrogen conversion, or the like).

In other embodiments, the PCUs 102 may be other types of power conditioning units; for example, the PCUs 102 may be DC-DC converters and the bus 106 may carry DC energy to a DC power distribution system and/or to a single centralized DC-AC inverter. The generated DC power may additionally or alternatively be supplied directly to commercial and/or residential systems via the load center 108, as well as stored for later use (for example, the generated energy may be stored utilizing batteries, heated water, hydro pumping, $H_2O$-to-hydrogen conversion, or the like).

In one or more alternative embodiments, the mounting assemblies 150 retain other types of electronics, such as LED drivers, DC optimizers, or other electronics that might have special PV mounting or thermal requirements.

Figure 2:
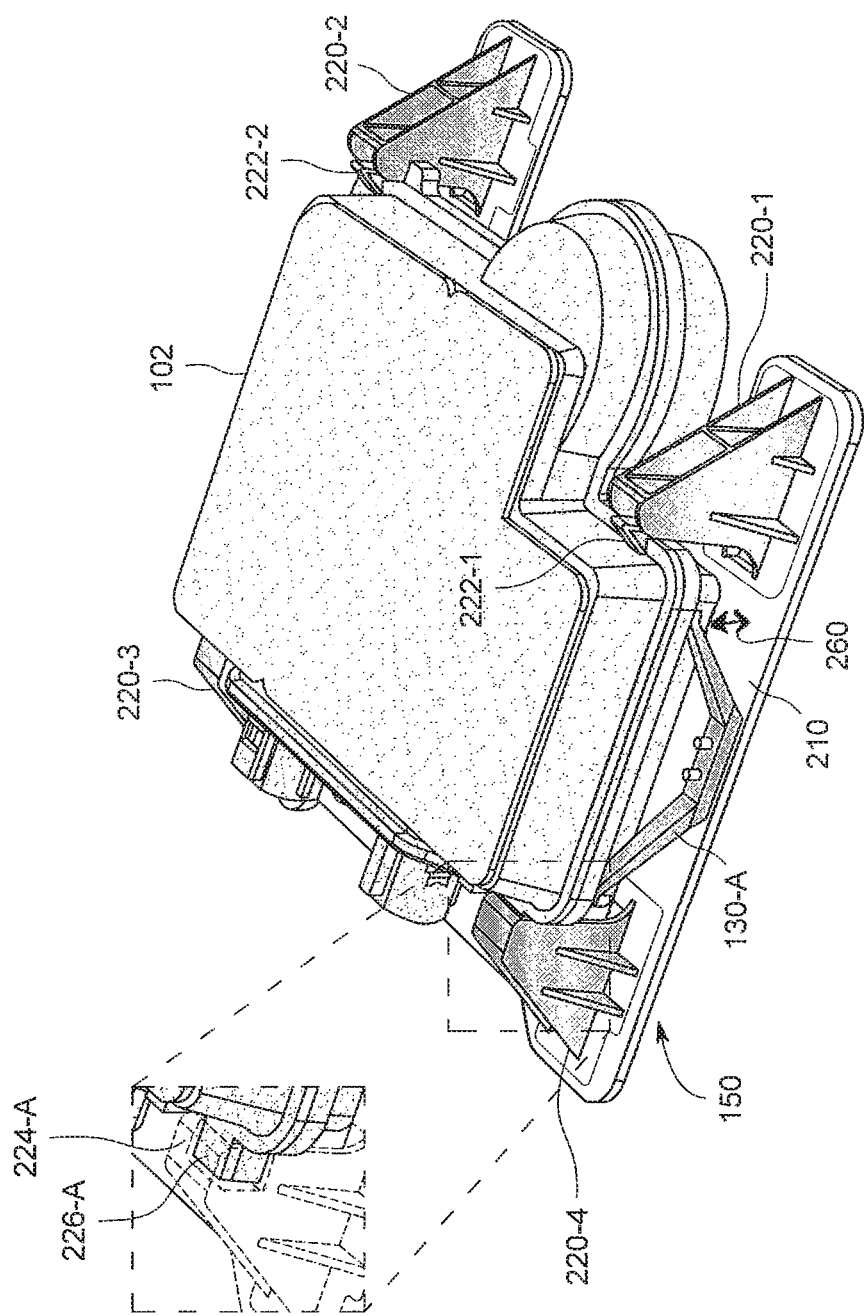
FIG. 2 is a top angled perspective view of a PCU mounting assembly coupled to a PCU in accordance with one or more embodiments of the present invention.

FIG. 2 is a top angled perspective view of a PCU mounting assembly 150 coupled to a PCU 102 in accordance with one or more embodiments of the present invention. The PCU mounting assembly 150 comprises a base member 210 generally shaped as a U-shaped rectangle and sized such that the outer edge of the base member 210 is slightly larger than the perimeter of the PCU 102. The base member 210 is formed from a non-electrically conductive (i.e., insulating) material, such as polycarbonate (PC), p-phenylene oxide (PPO™)+polystyrene (PS), p-phenylene ether (PPE), NORYL™, LEXAN™, or the like, and is adhered to the rear face of the corresponding PV module 104 (i.e., on the side of the PV module 104 not exposed to sunlight) as described further below with respect to FIG. 5.

The base member 210 further comprises a plurality of PCU retention members 220-1, 220-2, 220-3, and 220-4, collectively referred to as PCU retention members 220. The PCU retention members 220-1, 220-2, 220-3, and 220-4 extend perpendicular from the face to the base member 210 to retain the PCU 102. Each of the PCU retention members 220 comprises at least one PCU retention feature, such as a latch, a clip (e.g., a spring clip), a trap (to hold a protuberance of the PCU 102), and the like to mechanically secure the PCU 102 to the PCU mounting assembly 150. In some embodiments, such as the embodiment depicted in FIG. 2, the PCU retention members 220-1 and 220-2 comprise latches 222-1 and 222-2, respectively, each having a spring mechanism that retains the PCU 102 until the spring is displaced (e.g., by a tool, finger, or the like) in order to remove the PCU 102 as needed. Additionally, the PCU retention members 220-3 and 220-4 each define apertures, or "traps", suitably sized and shaped to accommodate corresponding protuberances of the PCU 102. For example, as shown in detail in FIG. 2, a trap 224-A of the PCU retention member 220-4 accommodates a PCU protrusion 226-A for retaining the PCU 102.

The PCU mounting assembly 150 further comprises one or more compression springs 130 that enable the PCU 102 to be maintained in one of two positions with respect to the PV module backsheet 180 as well as changed from one position to the other; i.e., the position of the PCU 102 with respect to the PV module backsheet 180 can be dynamically changed while the PCU 102 is mounted on the PV module backsheet 180.

As depicted in FIG. 2, the compression spring 130 is substantially shaped as a flat-bottom "V" (e.g., similar to a leaf spring) where the flat bottom is disposed on the top side of the arm of the base member 210 that runs between the PCU retention members 220-1 and 220-4. The obtuse-angled arms of the compression spring 130 are suitably sized and shaped such that the free ends of the arms contact the PCU 102 to maintain the PCU 102 is one of two positions with respect to the PV module backsheet 180. In the first position, the PCU 102 is pressed flat to the PV module backsheet 180 such that it is not proud of the PV module frame, for example in shipping, if laid on the ground or racking, and the like. The PCU 102 is maintained in the first position when pressed toward the PV module backsheet 180 or weighted down toward the PV module backsheet 180. For example, a restraining strap may be used to press the PCU 102 toward the PV module backsheet 180, or multiple PV module 104/PCU 102 assemblies may be stacked during shipping such that the compression spring 130 for each PCU mounting assembly 150 is compressed by the next PV module 104 above in the stack (or in the case of a vertical array the neighboring PV module 104 to the left or right). The PCU 102 moves from the first position to the second position when force applied to the PCU 102 toward the PV module backsheet 180 is removed, causing the compression spring 130 to automatically spring out (for example, by releasing a restraining strap or unstacking stacked PV module 104/PCU 102 assemblies), resulting in the second position as depicted in FIG. 2. The compression spring 130 maintains the PCU 102 in the second position such that an air gap 260 exists between the PCU 102 and the PV module backsheet 180 for improved thermal management of the PCU 102 and PV module backsheet 180. The air gap is generally on the order of 10-20 mm, although in other embodiments it may be larger or smaller.

The PCU mounting assembly 150 enables the PCU 102 to be attached with very tight lateral clearances to the PV module frame 160 and racking, whereas a sliding rail system requires almost twice the footprint when inserting and removing the PCU 102 from the rails due to the travel down the rails.

Figure 3:
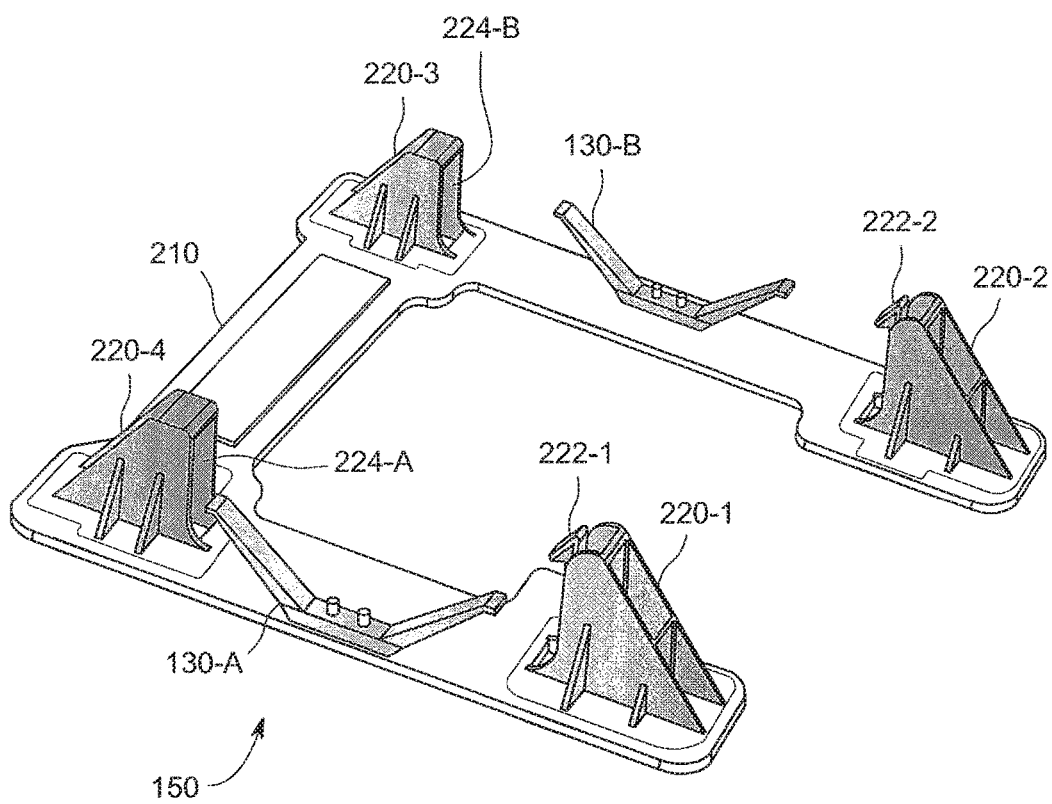
FIG. 3 is a top angled perspective view of a PCU mounting assembly in accordance with one or more embodiments of the present invention.

FIG. 3 is a top angled perspective view of a PCU mounting assembly 150 in accordance with one or more embodiments of the present invention. As previously described, the PCU mounting assembly 150 comprises the base member 210, the PCU retention members 220, and the latches 222. The traps 224-A and 224-B are defined by the PCU retention members 220-4 and 220-3, respectively.

As depicted in FIG. 3, the PCU mounting assembly 150 additionally comprises a first compression spring 130-A and a second compression spring 130-B (collectively referred to as compression springs 130) disposed along the parallel arms of the base member 210 such that the flat bottoms of the compression springs 130 are adhered to the surface of the base member 210 and the obtuse-angled arms of the compression springs 130 extend vertically from the base member 210 and parallel to the base member arms. In some embodiments, the ends of the compression spring arms may be flattened to lie flush against the PCU 102.

Generally, the compression springs 130 are formed from plastic since it does not need to be grounded and cannot be energized by a cut wire or cable, although in some embodiments one or both of the compression springs 130 may be an insulated metal spring mighting a thick polymer coating.

The compression springs 130 can be assembled by any suitable means to the base member 210 in a secondary step. For example, the compression springs 130 may be adhered to the base member 210 by one or more of glue, screws, and the like. In some other embodiments, a different number of compression springs 130 may be used and/or one or more of the compressions springs 130 may be located in a different position on the base member 210. Additionally or alternatively, one or more of the compression springs 130 may be shaped differently; for example, one or more compression springs 130 may be shaped as a coil.

The base member 210 may be made with a simple two-part cavity as the undercut regions can be created by pistons from the lower mold wall.

Figure 4:
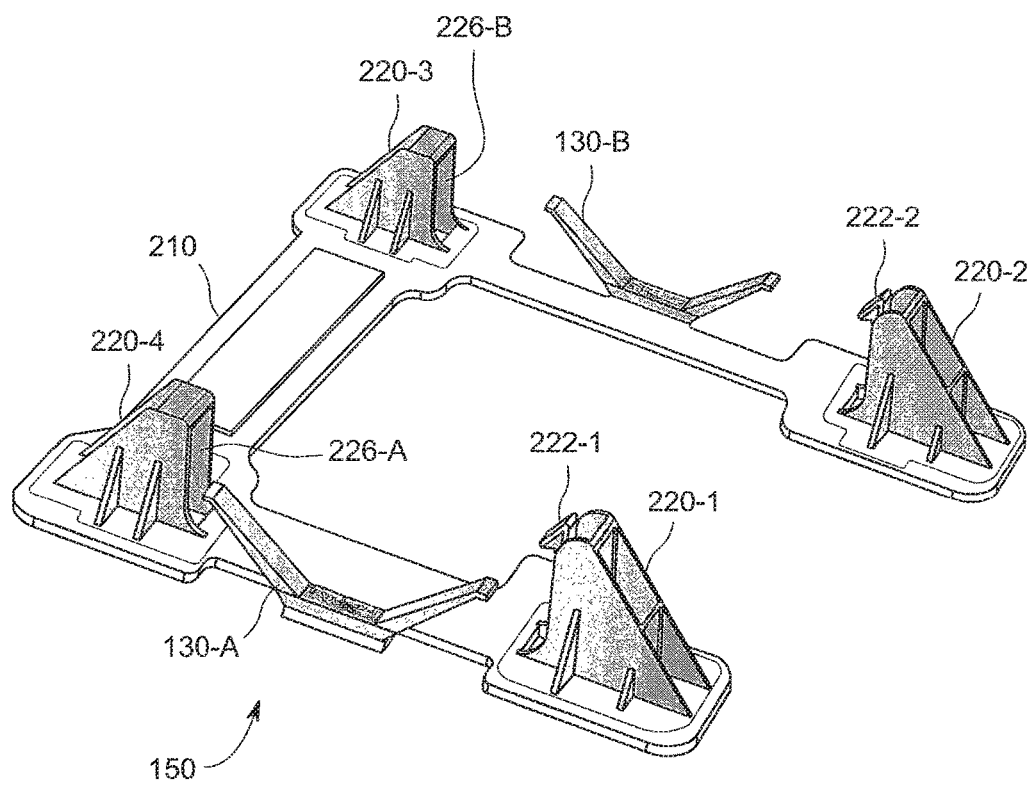
FIG. 4 is a top angled perspective view of a PCU mounting assembly in accordance with another embodiment of the present invention.

FIG. 4 is a top angled perspective view of a PCU mounting assembly 150 in accordance with another embodiment of the present invention. As previously described, the PCU mounting assembly 150 comprises the base member 210, the PCU retention members 220 and the latches 222, and the traps 224-A and 224-B are defined by the PCU retention members 220-4 and 220-3, respectively.

As depicted in FIG. 4, the outer edges of the base member arms are recessed and the first and second compression springs 130 are disposed along the member arms outer edges such that the obtuse-angled arms of the compression springs 130 extend vertically from the base member 210 and parallel to the base member arms, and in a position to contact the PCU 102 when it is mounted to the PCU mounting assembly 150. In the embodiment depicted in FIG. 4, the compression springs 130 are molded into the base member. Although the compression springs 130 are shown in FIG. 4 along the outer edges of the base member arms, in other embodiments one or both of the compression springs 130 may be in a different location on the base member 210, for example on top of the base member arms. Additionally or alternatively, a different number of compression springs 130 and/or differently shaped compression springs 130 may be used.

Figure 5:
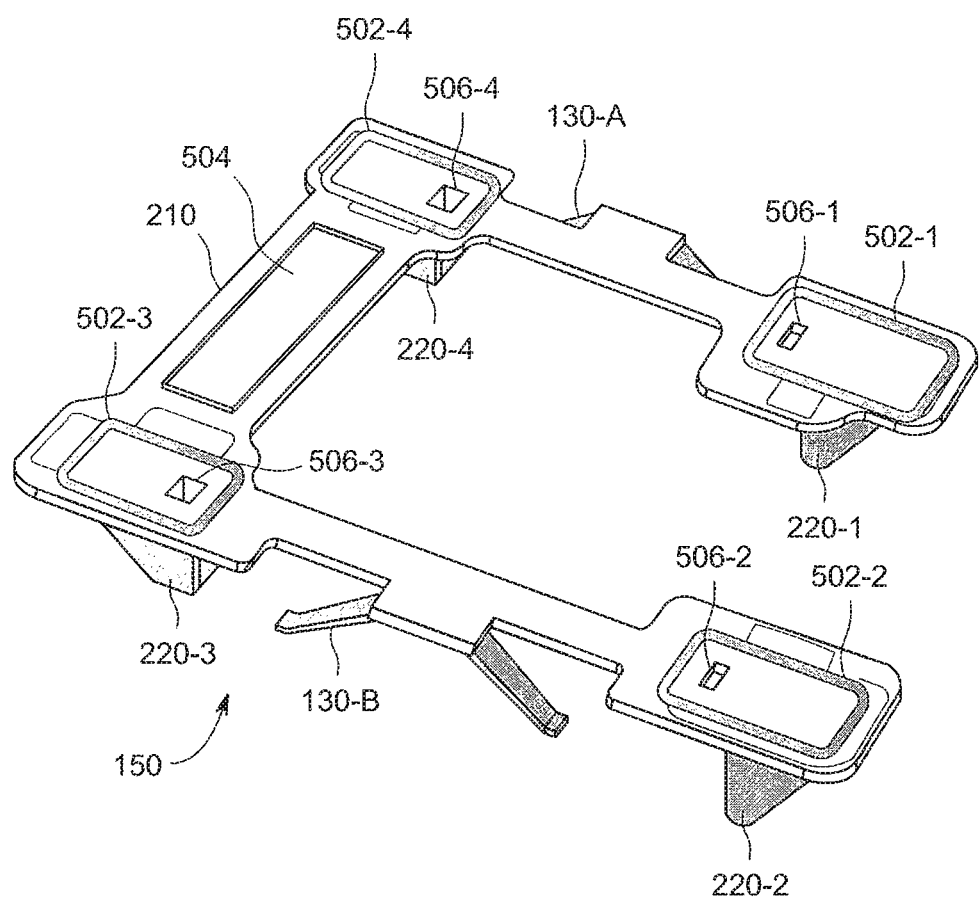
FIG. 5 is an angled bottom view of a PCU mounting assembly.

FIG. 5 is an angled bottom view of a PCU mounting assembly 150. As previously described, the PCU mounting assembly 150 comprises the base member 210, the PCU retention members 120, and the compression springs 130.

A plurality of adhesive regions 502-1, 502-2, 502-3, and 502-4 (collectively referred to as adhesive regions 502) are located on the underside of the base member 210 for dispensing adhesive to adhere the base member 210 to the PV module backsheet 180. As depicted in FIG. 5, the adhesive regions 502 are shaped as hollow oblong ovals with one adhesive region 502 corresponding to each of the four corners of the base member 210; e.g., in the embodiment of FIG. 5, the adhesive regions 502-1, 502-2, 502-3, and 502-4 are disposed on the backsheet-facing side of the base member 210 underneath the PCU retention members 220-1, 220-2, 220-3, and 220-4, respectively. In other embodiments, different sizes, shapes, and/or numbers of adhesive regions 502 may be used, as well as different locations for one or more of the adhesive regions.

The base member 210 defines a tape region 504 along the underside of the base portion between the base member arms. The tape region 504 is a recessed region defined for double-stick tape to be applied in order to adhere the base member 210 to the PV module backsheet 180 while the applied adhesive cures. In other embodiments, a different number of tape regions 504 may be used as well as differently sized and/or located tape regions 504.

Each corner of the base member 210 defines a rectangular-shaped cut-out 506-1, 506-2, 506-3, and 506-4, collectively referred to as cut-outs 506. The cut-outs 506 are required to allow the latches 222 and traps 224 to be formed since they are undercut regions and need a part of the mold tool to penetrate the base member 210 in order to support the undercut features in the mold. Alternatively, sliding features may be added in the mold that must be moved out of the way before the part could be ejected from the mold.

The foregoing description of embodiments of the invention comprises a number of elements, devices, circuits and/or assemblies that perform various functions as described. These elements, devices, circuits, and/or assemblies are exemplary implementations of means for performing their respectively described functions.

While the foregoing is directed to embodiments of the present invention, other and further embodiments of the invention may be devised without departing from the basic scope thereof, and the scope thereof is determined by the claims that follow.

The invention claimed is:

1. An apparatus for mechanically coupling a power conditioning unit (PCU) to a photovoltaic (PV) module, comprising:
   a mounting assembly comprising:
      a base member that mounts a power conditioning unit (PCU) on a PV module backsheet, the base member having (i) a first side that is adhered to the PV module backsheet and (ii) a second side that faces away from the plane of the PV module backsheet and has a plurality of upright PCU retention members extending from the second side for retaining the PCU; and
      at least one compression spring, coupled to the base member and disposed on the second side of the base member such that the at least one compression spring is disposed between (a) the PCU when the PCU is retained by the plurality of PCU retention members and (b) the PV module backsheet when the base member is adhered to the PV module backsheet, for maintaining the PCU in a position, with respect to the PV module backsheet and the base member, that can be dynamically changed between a first position at a first distance from the PV module backsheet and a second position at a second distance from the PV module backsheet.

2. The apparatus of claim 1, wherein the PCU is pressed flat to the PV module backsheet when the PCU is in the first position.

3. The apparatus of claim 1, wherein, when the PCU is in the second position, the PCU is extended away from the base member such that an airgap for thermal management exists between the PCU and the PV module backsheet.

4. The apparatus of claim 1, wherein the at least one compression spring comprises a first compression spring and a second compression spring disposed on parallel arms of the base member.

5. The apparatus of claim 1, wherein each compression spring of the at least one compression spring is substantially shaped as a flat-bottom "V".

6. The apparatus of claim 1, wherein the PCU is a DC-AC inverter.

7. The apparatus of claim 1, wherein the PCU is a DC-DC converter.

8. The apparatus of claim 1, wherein the at least one compression spring is mechanically secured to the base member.

9. The apparatus of claim 1, wherein each compression spring of the at least one compression spring is molded into the base member.

10. The apparatus of claim 1, wherein the PCU moves from the second position to the first position when force is applied to the PCU toward the PV module backsheet, and the PCU automatically moves from the first position to the second position when the force is removed.

11. A power module assembly, comprising:
a photovoltaic (PV) module;
a power conditioning unit (PCU) mounting assembling comprising (i) a base member having a first side that is adhered to the backsheet of the PV module and a second side that faces away from the plane of the PV module backsheet and comprises a plurality of upright PCU retention members extending from the second side, and (ii) at least one compression spring, coupled to the base member; and
a PCU mechanically coupled to the PCU mounting assembly by the plurality of PCU retention members, wherein the at least one compression spring (a) is disposed on the second side of the base member between the PCU and the PV module backsheet, and (b) maintains the PCU in a position, with respect to the PV module backsheet and the base member, that can be dynamically changed between a first position at a first distance from the PV module backsheet and a second position at a second distance from the PV module backsheet.

12. The power module assembly 11, wherein the PCU is pressed flat to the PV module backsheet when the PCU is in the first position.

13. The power module assembly of claim 11, wherein, when the PCU is in the second position, the PCU is extended away from the base member such that an airgap for thermal management exists between the PCU and the PV module backsheet.

14. The power module assembly of claim 11, wherein the at least one compression spring comprises a first compression spring and a second compression spring disposed on parallel arms of the base member.

15. The power module assembly of claim 11, wherein each compression spring of the at least one compression spring is substantially shaped as a flat-bottom "V".

16. The power module assembly of claim 11, wherein the PCU is a DC-AC inverter.

17. The power module assembly of claim 11, wherein the PCU is a DC-DC converter.

18. The power module assembly of claim 11, wherein the at least one compression spring is mechanically secured to the base member.

19. The power module assembly of claim 11, wherein each compression spring of the at least one compression spring is molded into the base member.

20. The power module assembly of claim 11, wherein the PCU moves from the second position to the first position when force is applied to the PCU toward the PV module backsheet, and the PCU automatically moves from the first position to the second position when PCU automatically moves from the first position to the second position when the force is removed.

* * * * *